United States Patent
Hagiwara (10) Patent No.: US 9,990,015 B2
(45) Date of Patent: Jun. 5, 2018

(54) INFORMATION PROCESSING APPARATUS CONFIGURED TO CONTROL COOLING OPERATION THEREOF BASED ON VARIABLE CONFIGURATION AND COOLING METHOD THEREFOR

(71) Applicant: CANON KABUSHIKI KAISHA, Tokyo (JP)

(72) Inventor: Yuichi Hagiwara, Toride (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days. days.

(21) Appl. No.: 15/249,943

(22) Filed: Aug. 29, 2016

(65) Prior Publication Data
US 2017/0060203 A1   Mar. 2, 2017

(30) Foreign Application Priority Data
Sep. 2, 2015   (JP) .................. 2015-173051

(51) Int. Cl.
*G06F 1/20* (2006.01)
*H05K 7/20* (2006.01)
*H04N 1/00* (2006.01)

(52) U.S. Cl.
CPC .............. *G06F 1/206* (2013.01); *H04N 1/00* (2013.01); *H05K 7/20209* (2013.01)

(58) Field of Classification Search
CPC .. G06F 1/206; G06F 1/20; H04N 1/00; H05K 7/20209

USPC ............................................ 399/92
See application file for complete search history.

(56) References Cited

U.S. PATENT DOCUMENTS

| | | | |
|---|---|---|---|
| 2006/0266510 A1 | 11/2006 | Nobashi | |
| 2010/0332037 A1* | 12/2010 | Mikami | H05K 7/20209 700/282 |
| 2014/0092412 A1* | 4/2014 | Jeong | H04N 1/00832 358/1.13 |

FOREIGN PATENT DOCUMENTS

JP    2006330913 A    12/2006

* cited by examiner

*Primary Examiner* — Billy Lactaoen
(74) *Attorney, Agent, or Firm* — Rossi, Kimms & McDowell LLP (57) ABSTRACT

An information processing apparatus which enables appropriate cooling at low cost. A MFP 101 as an information processing apparatus has a controller cooling fan 116, a temperature sensor 121 measuring temperature of a CPU 110, and a controller 105 provided with a power-source/fan control IC 115, an HDD-A 119 and an HDD-B 120. When mirroring control is not applied to the MFP 101, the power-source/fan control IC 115 controls the rotation of the controller cooling fan 116 according to the temperature measured by the temperature sensor 121. When mirroring control is applied to the MFP 101, the power-source/fan control IC 115 continues to rotate the controller cooling fan 116.

24 Claims, 10 Drawing Sheets

INFORMATION PROCESSING APPARATUS CONFIGURED TO CONTROL COOLING OPERATION THEREOF BASED ON VARIABLE CONFIGURATION AND COOLING METHOD THEREFOR

BACKGROUND OF THE INVENTION

Field of the Invention

The present invention relates to an information processing apparatus and a cooling method therefor, and in particular to an information processing apparatus with a variable configuration and a cooling method therefor.

Description of the Related Art

In information processing apparatuses such as MFPs, printers, client PCs, and servers, the amount of heat generated by a CPU increases with an increase in the amount of information to be processed, and it is thus necessary to cool the information processing apparatuses. To cool the information processing apparatuses, a cooling fan incorporated in the information processing apparatuses is used, but the cooling fan makes operating noise. On the other hand, there is an increasing demand from users to silence the information processing apparatuses, and it is thus preferred that the cooling fan is not continuously run. For example, the cooling fan is stopped in a low power consumption state such as a standby mode in which power is supplied to the CPU but no power is supplied to some of the other component elements. Alternatively, the information processing apparatuses are equipped with a temperature sensor that measures a temperature of the CPU, and the cooling fan is run according to the temperature of the CPU.

The information processing apparatuses are ordinarily equipped with not only the CPU but also a hard disk drive (hereafter referred to as "the HDD") for storing data. The HDD as well as the CPU generates heat while it is running, but even after processing by the CPU is ended, access to the HDD is allowed, and hence even in the low power consumption state, the HDD may be run to generate heat, and as a result, heated to a high temperature. Moreover, when the information processing apparatuses shift into the low power consumption state and stop the cooling fan after continuously executing a print job for several hours, the HDD heated to a high temperature due to access during the execution of the print job is not easily cooled.

In recent years, there has been a growing demand for ensuring integrity of information in the information processing apparatuses, and hence a technique to store data in a multiplexed manner, for example, mirroring control that is a control technique to store the same data in a plurality of HDDs is used. In information processing apparatuses to which mirroring control is applied, there is a plurality of HDDs which are heating sources, and when one of the HDDs is replaced with a new HDD, data is copied (rebuilt) from another HDD to the new HDD, and hence the frequency with which the HDD runs is increased. As a result, the amount of heat generation in the information processing apparatuses considerably increases. Namely, recent information processing apparatuses to which mirroring control is applied are likely to be heated to a high temperature, and there is a fear of breakdown of HDDs.

To cope with this, there has been proposed a technique that uses not only a temperature sensor that measures a temperature of a CPU but also, for example, a temperature sensor that measures a temperature of another component element such as an HDD and controls operation of a cooling fan according to measured temperatures of the respective component elements (see Japanese Laid-Open Patent Publication (Kokai) No. 2006-330913). According to this technique, even if the measured temperature of the CPU is low, the cooling fan is run as long as the measured temperature of the HDD is high, and this prevents the HDD from being heated to a high temperature and breaking down.

However, the technique described in Japanese Laid-Open Patent Publication (Kokai) No. 2006-330913 requires a plurality of temperature sensors, and hence the cost of an information processing apparatus becomes high. Moreover, there may be cases where an optional board for expanding functions is added to or an HDD is added to an information processing apparatus, but according to the technique described in Japanese Laid-Open Patent Publication (Kokai) No. 2006-330913, no temperature sensors that measure temperatures of the added component elements are provided. Thus, according to the technique described in Japanese Laid-Open Patent Publication (Kokai) No. 2006-330913, when component elements are added to the information processing apparatus, it is impossible to control operation of the cooling fan with consideration given to cooling of the added component elements. Namely, in the existing information processing apparatuses, appropriate cooling at low cost is difficult.

SUMMARY OF THE INVENTION

The present invention provides an information processing apparatus which enables appropriate cooling at low cost, and a cooling method therefor.

Accordingly, the present invention provides an information processing apparatus comprising a cooling device, a temperature sensor, an interface to which plural storage devices can be connected, and a control unit configured to control operation of the cooling device, wherein the control unit determines, based on a connection status of the plural storage devices connected to the interface, whether to control the operation of the cooling device according to detection result of the temperature sensor or to control the operation of the cooling device irrespective of the detection result of the temperature sensor.

Accordingly, the present invention provides a cooling method for an information processing apparatus that has a cooling device, a temperature sensor and an interface to which plural storage devices can be connected, the control method comprising determining, based on a connection status of the plural storage devices connected to the interface, whether to control the operation of the cooling device according to detection result of the temperature sensor or to control the operation of the cooling device irrespective of the detection result of the temperature sensor.

According to the present invention, appropriate cooling at low cost is possible.

Further features of the present invention will become apparent from the following description of exemplary embodiments (with reference to the attached drawings).

DESCRIPTION OF THE EMBODIMENTS

Hereafter, embodiments of the present invention will be described in detail with reference to the drawings. In the following description of the embodiments, it is assumed that the present invention is applied to an image forming apparatus such as an MFP (multifunctional peripheral) which is an information processing apparatus. The present invention, however, may also be applied to a printer which is an image forming apparatus or applied to an information processing apparatus having no image forming function such as a server, a PC, or a smart electrical household appliance. Specifically, the present invention may be applied to any information processing apparatuses as long as they have a cooling fan.

First, a description will be given of a first embodiment of the present invasion.

Figure 1A:
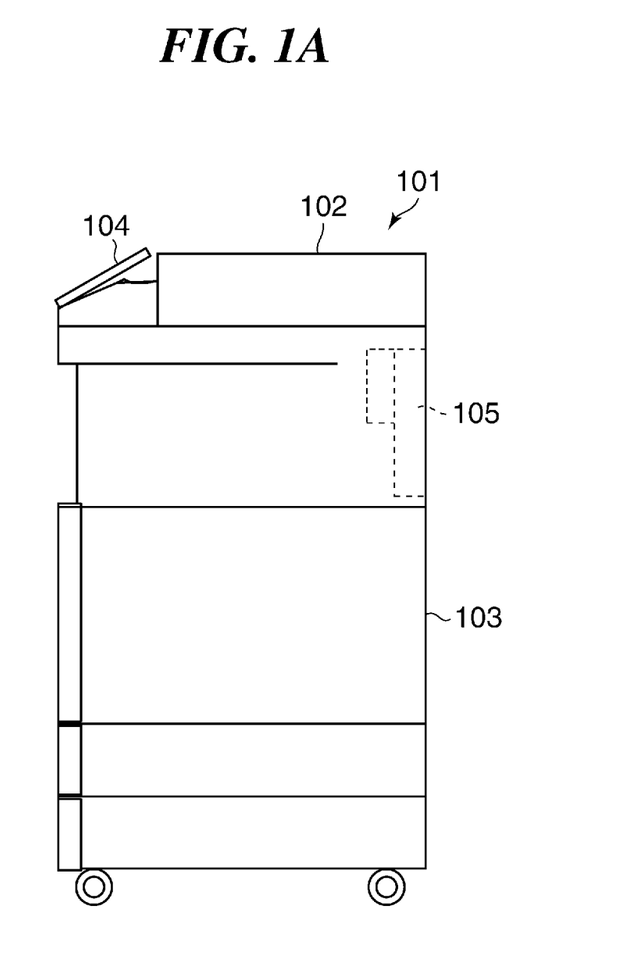
FIG. 1A is a right side view schematically showing an external appearance of an MFP that is an information processing apparatus according to a first embodiment of the present invention.
Figure 1B:
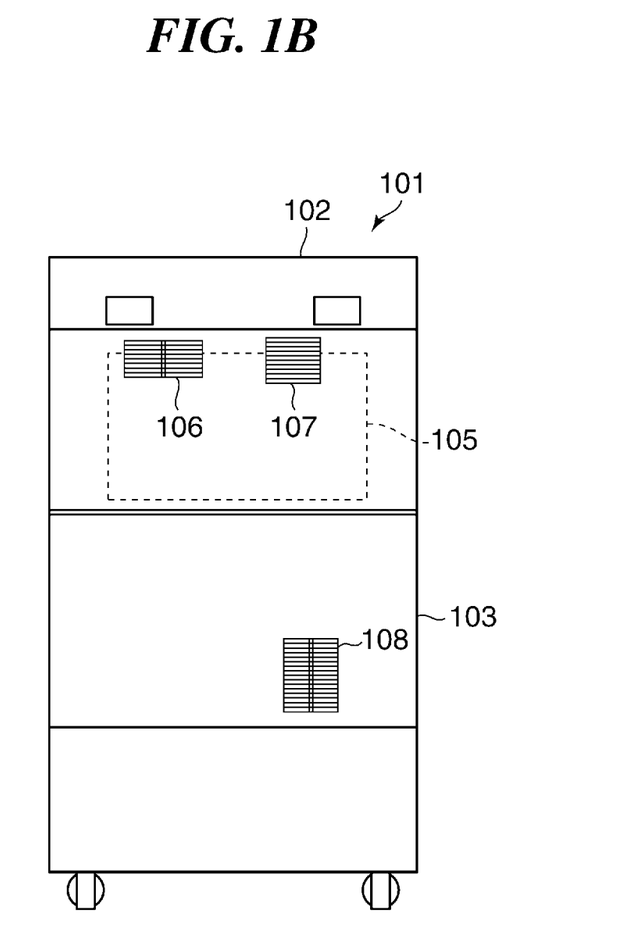
FIG. 1B is a rear view schematically showing the external appearance of the MFP that is an information processing apparatus according to the first embodiment of the present invention.

FIGS. 1A and 1B are a right side view and a rear view, respectively, schematically showing an external appearance of an MFP that is an information processing apparatus according to the present embodiment.

Referring to FIGS. 1A and 1B, an MFP 101 has a scanner unit 102, a printer unit 103, an operating unit 104, and a controller 105 (interface). The scanner unit 102, which is an image input device, reads an image off an original to generate image data. The printer unit 103, which is an image output device, prints image data on a recording sheet and outputs the recording sheet as printed matter. The operating unit 104, which is comprised of a display, receives inputs from a user or displays a status of the MFP 101. The controller 105 controls operation of the scanner unit 102 and the printer unit 103 and performs image processing. In the MFP 101, the operating unit 104 is provided in an upper part of a front side of the MFP 101, and the controller 105 is incorporated in a rear side of the MFP 101. An inlet 106, which is an intake for outside air, and outlets 107 and 108, through which heat inside the MFP 101 is discharged, are formed in a rear surface of the MFP 101.

Figure 2:
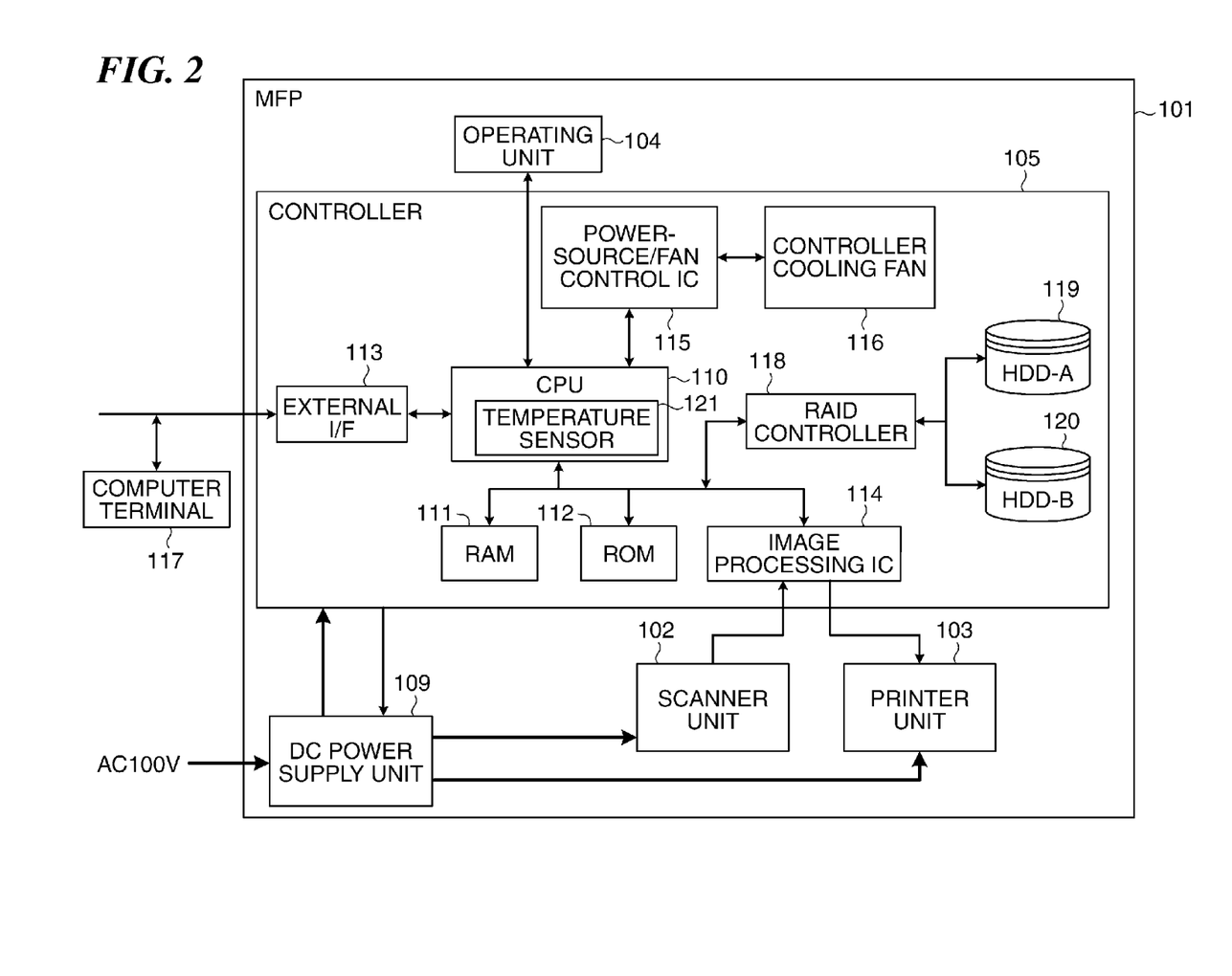
FIG. 2 is a block diagram schematically showing an arrangement of the MFP in FIGS. 1A and 1B.

FIG. 2 is a block diagram schematically showing an arrangement of the MFP in FIGS. 1A and 1B.

Referring to FIG. 2, the MFP 101 has a DC power supply unit 109 as well as the scanner unit 102, the printer unit 103, the operating unit 104, and the controller 105 described above. The DC power supply unit 109 generates DC power from an AC power source and supplies the DC power to components of the MFP 101. The controller 105 has a CPU 110 that controls the entire MFP 101, a RAM 111 that acts a main memory comprised of a DRAM or the like which is a work area for the CPU 110, and a ROM 112 in which, for example, a boot program for a control system of the MFP 101 is stored. It should be noted that setting information on whether or not to apply mirroring control is stored in the ROM 112. The controller 105 has an external interface (I/F) 113, an image processing IC 114, a power-source/fan control IC 115 (control unit), and a controller cooling fan 116 (cooling device). The external interface 113 is connected to a computer terminal 117, which is an external device, via a LAN (local area network), a USB (universal serial bus), or the like. The image processing IC 114 is an ASIC (application specific integrated circuit). The image processing IC 114 performs a variety of image processing to convert image data, which is input from the scanner unit 102 and the external interface 113, into image data that is to be printed on recording sheets by the printer unit 103. The power-source/fan control IC 115 controls operation of the controller cooling fan 116. The controller 105 also has a RAID controller 119 and an HDD (hard disk drive)-A 119 and an HDD-B 120, both of which are storage devices. The RAID controller 118 provides mirroring control using the HDD-A 119 and the HDD-B 120. The mirroring control is to store the same data in a plurality of HDDs and has a data restoring function called a rebuilding function. The rebuilding function is a function of, when a faulty HDD is replaced with a new HDD, copying (rebuilding) data to the new HDD from another HDD so that data stored in the faulty HDD can be restored in the new HDD. The HDD-A 119 and the HDD-B 120 store, for example, a variety of programs, image data, and data for constructing an operating system in accordance with instructions from the CPU 110.

The CPU 110 has a temperature sensor 121, which is a thermistor, incorporated therein and measures a junction temperature in the CPU 110. The power-source/fan control IC 115 issues a power supply stop instruction to the DC power supply unit 109 when the MFP 101 shifts into a sleep mode, for example, when the MFP 101 has not been in use over a predetermined time period or when an instruction to shift into the sleep mode has been issued. In response to the power supply stop instruction, the DC power supply unit 109 stops supplying power to component elements of the MFP 101 including the CPU 110. Also, when a factor for returning from the sleep mode arises and it is necessary to shift into a standby mode, the power-source/fan control IC 115 instructs the DC power supply unit 109 to shift from the sleep mode into the standby mode. In response to the instruction to shift into the standby mode, the DC power supply unit 109 supplies power to the CPU 110 and restricts or stops supply of power to some of the other component elements of the MFP 101. Further, the power-source/fan control IC 115 controls operation of the controller cooling fan 116 according to an operational status of the MFP 101 and a temperature measured by the temperature sensor 121.

Figure 3A:
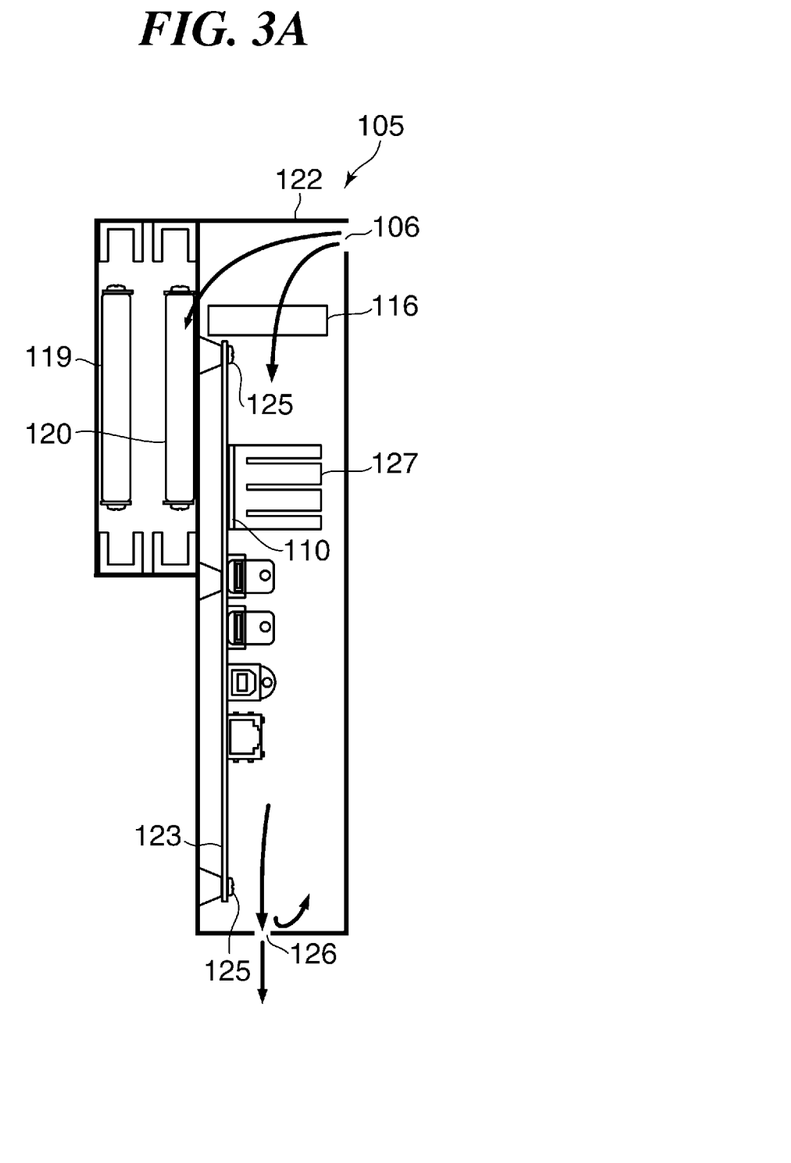
FIG. 3A is a view useful in explaining a hardware arrangement of a controller in FIGS. 1A, 1B, and 2.
Figure 3B:
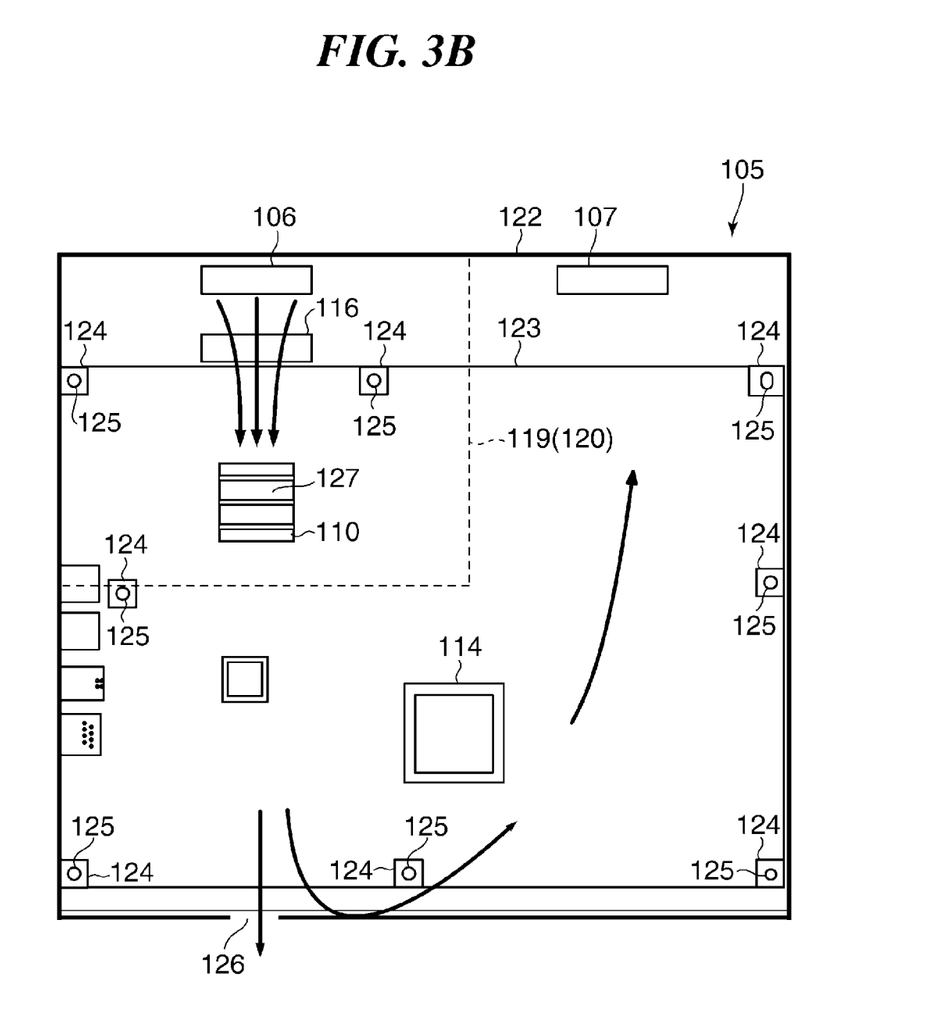
FIG. 3B is a view useful in explaining the hardware arrangement of the controller in FIGS. 1A, 1B, and 2.

A detailed description will now be given of a hardware arrangement of the controller 105. FIGS. 3A and 3B are views useful in explaining the hardware arrangement of the controller in FIGS. 1A, 1B, and 2, FIG. 3A showing the controller as seen from the right, and FIG. 3B showing the controller as seen from behind. To make explanation easier, both of the figures are drawn so that an internal hardware arrangement of the controller 105 can be seen through.

Referring to FIGS. 3A and 3B, the controller 105 has a box-shaped main body 122, which is made of sheet metal, a printed-circuit board 123, the HDD-A 119 and the HDD-B 120. The printed-circuit board 123 has a plurality of IC chips (not shown) mounted thereon and has a plurality of punched screw holes 124. The printed-circuit board 123 is incorporated into and fixed to the main body 122 by screws 125 fitted into the respective screw holes 124. The HDD-A 119 and the HDD-B 120 as well are removably incorporated into the main body 122. In an outlet 126 provided in a bottom of the main body 122 and an inlet 106 and an outlet 107 provided in a rear surface of the main body 122, a number of holes (not shown) are punched so as to have a honeycomb structure. The CPU 110 generating a large amount of heat is provided with a heat sink 127, which efficiently releases heat from the CPU 110. The controller cooling fan 116 is provided in proximity to the inlet 106. When the controller cooling fan 116 is activated, air from the outside of the MFP 101 with a relatively low temperature flows into the main body 122 through the inlet 106 to produce an internal current of air (indicated by arrows in the figure). The internal current of air is diverted by a duct and a fin (both of which are not shown) such that most of the internal current of air flows toward the CPU 110 (the heat sink 127), and a part of the internal current of air flows toward the HDD-A 119 and the HDD-B 120. As a result, the internal current of air cools the CPU 110, the HDD-A 119 and the HDD-B 120. When the controller cooling fan 116 stops, air from the outside of the MFP 101 does not flow into the main body 122, and hence no current of air is produced, and the CPU 110, the HDD-A 119 and the HDD-B 120 are not cooled. A part of the internal current of air that has cooled the CPU 110, the HDD-A 119 and the HDD-B 120 is discharged externally from the main body 122 through the outlet 126 at the bottom of the main body 122. Another part of the internal current of air collides with the bottom of the main body 122, flows upward, and is discharged externally from the main body 122 through the outlet 107. Namely, the controller 105 diverts the internal current of air generated by the controller cooling fan 116 to cool efficiently the component elements that generate heat (not only the CPU 110, the HDD-A 119 and the HDD-B 120 but also the image processing IC 114 and others).

Figure 4:
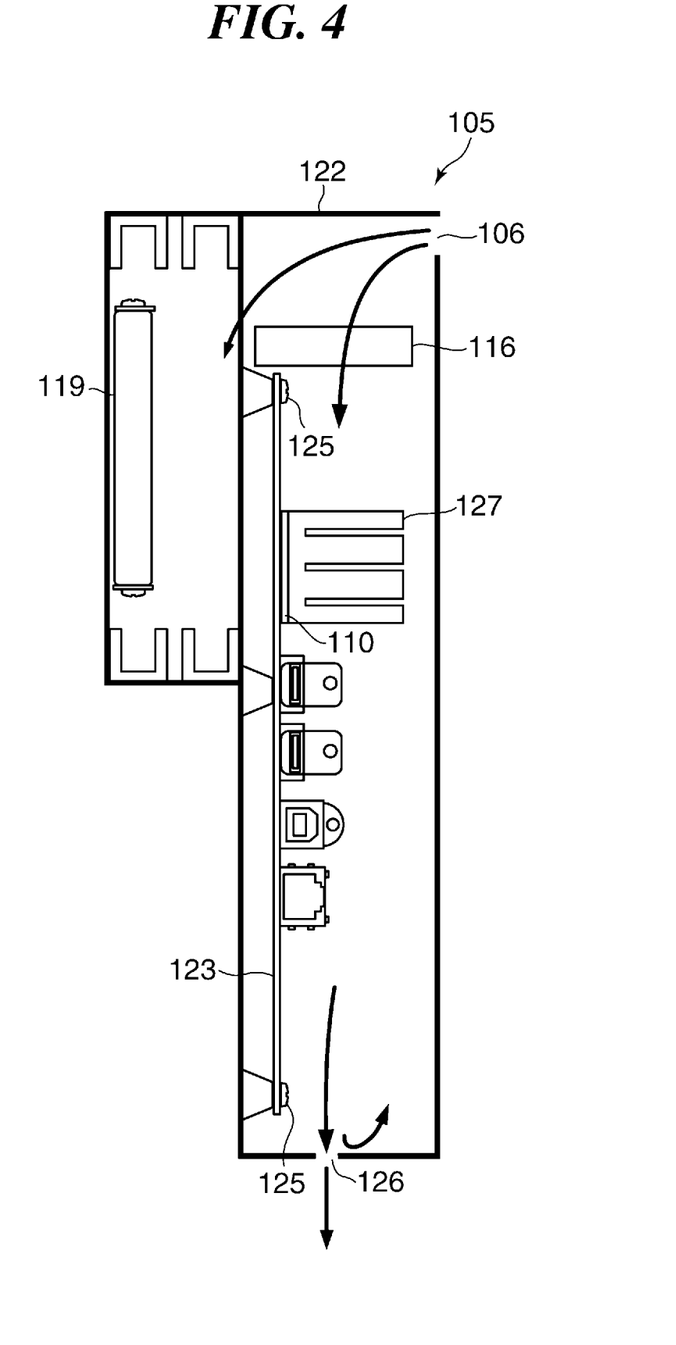
FIG. 4 is a view useful in explaining the hardware arrangement of the controller in a case where only one HDD is installed.

A description will now be given of a method for controlling the controller cooling fan, which is a method for cooling the information processing apparatus according to the present embodiment. First, a description will be given of a case where the controller 105 is not equipped with the HDD-B 120 but is equipped with only the HDD-A 119 (see FIG. 4), that is, a case where mirroring control is not applied to the MFP 101.

Figure 5:
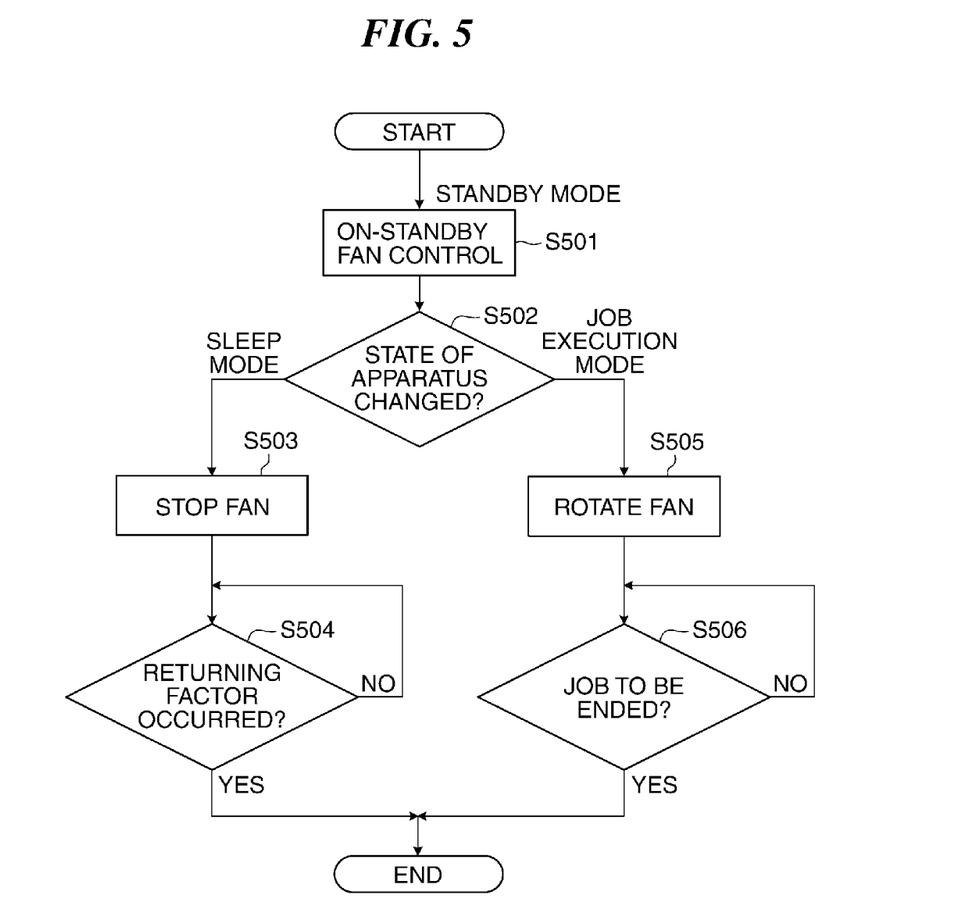
FIG. 5 is a flowchart of a method for controlling a controller cooling fan, which is a method for cooling the information processing apparatus according to the first embodiment of the present invention.

FIG. 5 is a flowchart of the method for controlling the controller cooling fan, which is the method for cooling the information processing apparatus according to the present embodiment. Steps in this method are implemented by the CPU 110 executing a program for this method unless otherwise specified.

First, when activated, the MFP 101 shifts into the standby mode i.e. a state of readiness to receive a job. At this time, the CPU 110 carries out a process to control the controller cooling fan 116 in the standby mode, to be described later (hereafter referred to as "the on-standby fan control process"), (step S501). Next, in step S608, to be described later, when it is judged that the standby mode has been brought to an end, it is determined whether the MFP 101 is to shift into a job execution mode, in which it executes a job, or the sleep mode (step S502). Here, the case where it is judged that the standby mode has been brought to an end corresponds to a case where a job has been received or a case where the MFP 101 has not been in use over a predetermined time period.

As a result of the determination in the step 502, the MFP 101 is to shift into the sleep mode, the power-source/fan control IC 115 stops supplying power to almost all of the component elements of the controller 105 except for the external interface 113 and others. At this time, the supply of power to the CPU 110 and the controller cooling fan 116 is stopped as well, and hence the controller cooling fan 116 stops (step S503). This prevents rotational noise of the controller cooling fan 116 from being made and satisfies a user's demand to reduce noise. It is then determined whether or not a factor for returning from the sleep mode arises (step S504). When no factor for returning from the sleep mode arises, the process returns to the step S504, and when a factor for returning from the sleep mode arises, the method is brought to an end. After that, although not shown in the figure, the MFP 101 shifts into the standby mode, in which the on-standby fan control process in the step S501 is carried out. It should be noted that examples of a factor for returning from the sleep mode include input of a user's instruction to return from the sleep mode and placement of an original on the scanner unit 102.

As a result of the determination in the step 502, the MFP 101 is to shift into the job execution mode, the CPU 110 instructs the power-source/fan control IC 115 to rotate the controller cooling fan 116 irrespective of the temperature measured by the temperature sensor 121. In response to this instruction, the power-source/fan control IC 115 continues to rotate the controller cooling fan 116 while a job such as a scanning operation, a printing operation or the like is being executed (step S505). At this time, rotational noise of the controller cooling fan 116 is made, and while a job is being executed, motor rotational noise and fan rotational noise of the scanner unit 102 and the printer unit 103 are made, and on the whole, their rotational noise is larger than that of the controller cooling fan 116. Thus, even if the controller cooling fan 116 is continuously rotated, this does not defy a user's request to reduce noise. Also, by continuously rotating the controller cooling fan 116, an internal current of air is caused to constantly flow toward the CPU 110 and the HDD-A 119, and hence the CPU 110 and the HDD-A 119 are cooled to the extent possible. Then, whether or not the job has been ended is determined (step S506). When the job has not been ended, the process returns to the step S506, and when the job has been ended, the present process is brought to an end. After that, although not shown in the figure, the MFP 101 shifts into the standby mode, in which the on-standby fan control process in the step S501 is carried out.

Figure 6:
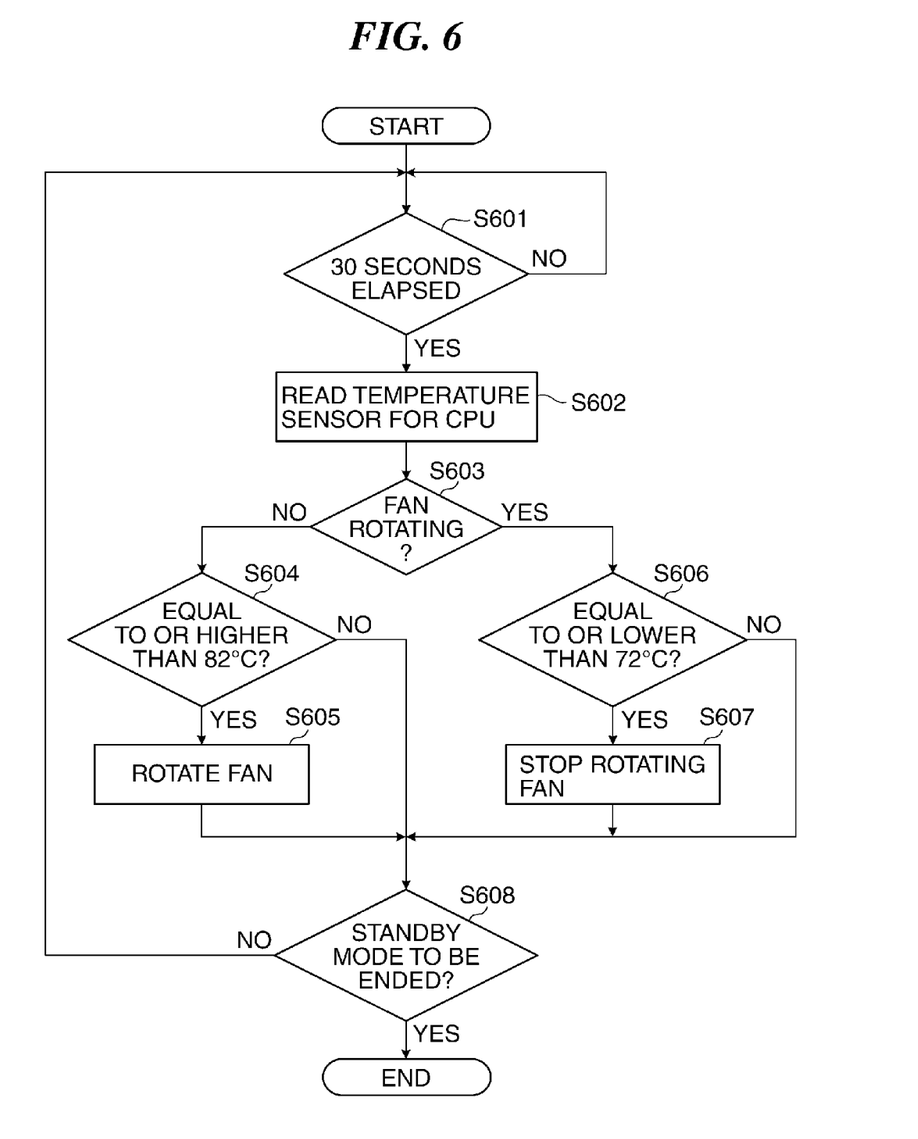
FIG. 6 is a flowchart showing an on-standby fan control process that is carried out in step S501 in FIG. 5 when mirroring control is not applied to the MFP.

FIG. 6 is a flowchart showing the on-standby fan control process that is carried out in the step S501 in FIG. 5. Steps in this process as well are implemented by the CPU 110 executing a program for this process unless otherwise specified. It should be noted that the process in FIG. 6 as well is based on the assumption that mirroring control is not applied to the MFP 101.

First, when the MFP 101 shifts into the standby mode, the CPU 110 reads the temperature measured by the temperature sensor 121 at intervals of a predetermined time period, for example, at intervals of 30 seconds (steps S601, S602). Next, the CPU 110 determines whether or not the controller cooling fan 116 is rotating (step S603). For example, as a result of the determination in the step S504, when a factor for returning from the sleep mode has arisen, and the MFP 101 has shifted into the standby mode, the controller cooling fan 116 is at a standstill in the step S603. As a result of the determination in the step S506, when the job has been ended, and the MFP 101 has shifted into the standby mode, the controller cooling fan 116 is rotating in the step S603.

As a result of the determination in the step S603, when the controller cooling fan 116 is at a standstill, it is determined whether or not the temperature measured by the temperature sensor 121, which was read in the step S602, is equal to or higher than a predetermined temperature, for example, 82° C. (step S604). As a result of the determination in the step S604, when the temperature measured by the temperature sensor 121 is equal to or higher than 82° C., the CPU 110 instructs the power-source/fan control IC 115 to rotate the controller cooling fan 116. In response to this instruction, the power-source/fan control IC 115 rotates the controller cooling fan 116 (step S605), followed by the process proceeding to step S608. As a result of the determination in the step S604, when the temperature measured by the temperature sensor 121 is lower than 82° C., the process proceeds to the step S608 without the controller cooling fan 116 being rotated.

As a result of the determination in the step S603, when the controller cooling fan 116 is rotating, it is determined whether or not the temperature measured by the temperature sensor 121, which was read in the step S602, is equal to or lower than another predetermined temperature, for example, 72° C. (step S606). As a result of the determination in the step S606, when the temperature measured by the temperature sensor 121 is equal to or lower than 72° C., the CPU 110 instructs the power-source/fan control IC 115 to stop the controller cooling fan 116. In response to this instruction, the power-source/fan control IC 115 stops the controller cooling fan 116 (step S607), followed by the process proceeding to the step S608. As a result of the determination in the step S606, when the temperature measured by the temperature sensor 121 is higher than 72° C., the process proceeds to the step S608 without the controller cooling fan 116 being stopped.

It is then determined whether or not to end the standby mode (step S608). In the step S608, when a job is received or when the MFP 101 has not been in use over a predetermined time period, it is determined that the standby mode is to be ended. As a result of the determination in the step S608, when the standby mode is not to be ended, the process returns to the step S601, and when the standby mode is to be ended, the present process is ended, followed by the process proceeding to the step S502.

According to the process in FIG. 6, the controller cooling fan 116 does not rotate unless the temperature measured by the temperature sensor 121 (the temperature of the CPU 110) becomes equal to or higher than 82° C. Further, when the temperature measured by the temperature sensor 121 (the temperature of the CPU 110) becomes equal to or lower than 72° C., the controller cooling fan 116 stops. This reduces the frequency with which the controller cooling fan 116 rotates and the frequency with which rotational noise of the controller cooling fan 116 is made. As a result, the user's demand to reduce noise is satisfied.

The processes in FIGS. 5 and 6 described above are based on the assumption that mirroring control is not applied to the MFP 101. However, when mirroring control is applied to the MFP 101, the HDD-B 120 which is a heating source is added, and the rebuilding function of the mirroring control is performed, bringing about a considerable increase in the amount of heat generation in the MFP 101. Accordingly, in the present embodiment, when mirroring control is applied to the MFP 101, the on-standby fan control process (the process in FIG. 6) in the step S501 is modified to improve cooling performance of the MFP 101.

Figure 7:
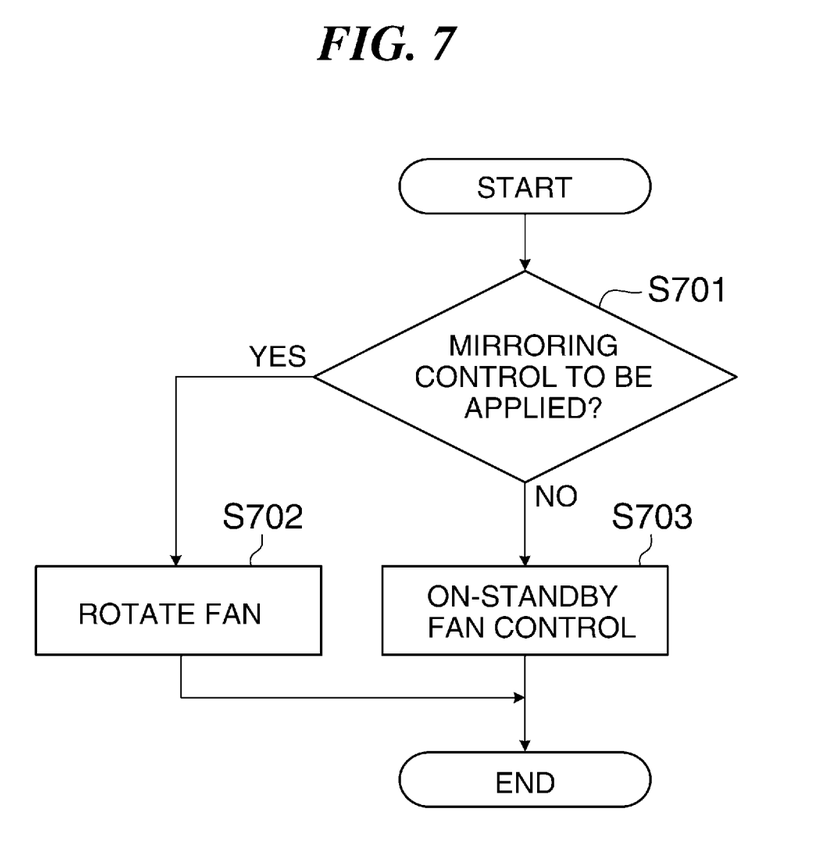
FIG. 7 is a flowchart showing an on-standby fan control process that is carried out in the step S501 in FIG. 5 when mirroring control is applied to the MFP.

FIG. 7 is a flowchart showing an on-standby fan control process which is carried out in the step S501 in FIG. 5 when mirroring control is applied to the MFP 101. Steps in this process as well are implemented by the CPU 110 executing a program for this process unless otherwise specified.

When the MFP 101 is activated and shifts into the standby mode, it is determined whether or not mirroring control is applied to the MFP 101 (step S701). Whether or not mirroring control is applied to the MFP 101 is determined based on setting information stored in the ROM 112 as to whether mirroring control is applied to the MFP 101. In the MFP 101, when the user additionally installs the HDD-B 120, or when an instruction to apply mirroring control is input through a button or the like using the operating unit 104, setting information indicating that mirroring control is to be applied is stored in the ROM 112. When the user removes the HDD-B 120, or when an instruction not to apply mirroring control is input through the button or the like using the operating unit 104, setting information indicating that mirroring control is not to be applied is stored in the ROM 112.

As a result of the determination in the step S701, when mirroring control is not applied to the MFP 101, the on-standby fan control process in FIG. 6 is carried out (step S703). When mirroring control is applied to the MFP 101, the CPU 110 instructs the power-source/fan control IC 115 to rotate the controller cooling fan 116 irrespective of a temperature measured by the temperature sensor 112. In response to this instruction, the power-source/fan control IC 115 continues to rotate the controller cooling fan 116 (step S702). After that, the present process is ended, followed by the process proceeding to the step S502.

According to the process in FIG. 7, when mirroring control is not applied to the MFP 101, for example, when only the HDD-A 119 is installed in the controller 105, operation of the controller cooling fan 116 is controlled according to the temperature measured by the temperature sensor 121. When mirroring control is applied to the MFP 101, for example, when the HDD-B 120 is additionally installed in the controller 105, the controller cooling fan 116 is continuously rotated irrespective of the temperature measured by the temperature sensor 121. As a result, even when the configuration of the MFP 101 is changed, the method for controlling the controller cooling fan 116 is allowed to be changed without the need to add a temperature sensor for the HDD-B 120, and cooling is appropriately performed in the MFP 101 in response to a change in its configuration. Further, when the HDD-B 120 is installed in the MFP 101 to increase the amount of heat, the controller cooling fan 116 is continuously rotated, and this prevents the HDD-A 119 and the HDD-B 120 from being heated to a high temperature and breaking down.

Moreover, according to the process in FIG. 7, when the MFP 101 is in the standby mode, the method for controlling the controller cooling fan 116 is changed according to whether or not mirroring control is applied to the MFP 101. Namely, even in the standby mode in which the controller cooling fan 116 would be conventionally stopped according to a temperature of the CPU 110, the controller cooling fan 116 runs when necessary, irrespective of a temperature of the CPU 110. This prevents the HDD-A 119 and the HDD-120 from being heated to a high temperature and breaking down.

A description will now be given of a second embodiment of the present invention.

The second embodiment of the present invention differs from the first embodiment only in that in an on-standby fan control process, operation of the controller cooling fan 116 is controlled according to not only a temperature of the CPU 110 but also temperatures of the HDD-A 119 and the HDD-B 120. Features of constructions and operations that are the same as those in the first embodiment will thus not be described, only constructions and operations different from those of the first embodiment being described below.

In the first embodiment, when mirroring control is applied to the MFP 101, the controller cooling fan 116 continues to rotate in the standby mode. To cope with this, in the present embodiment, even when mirroring control is applied to the MFP 101, and the MFP 101 is in the standby mode, the controller cooling fan 116 is restrained from continuing to rotate.

Figure 8:
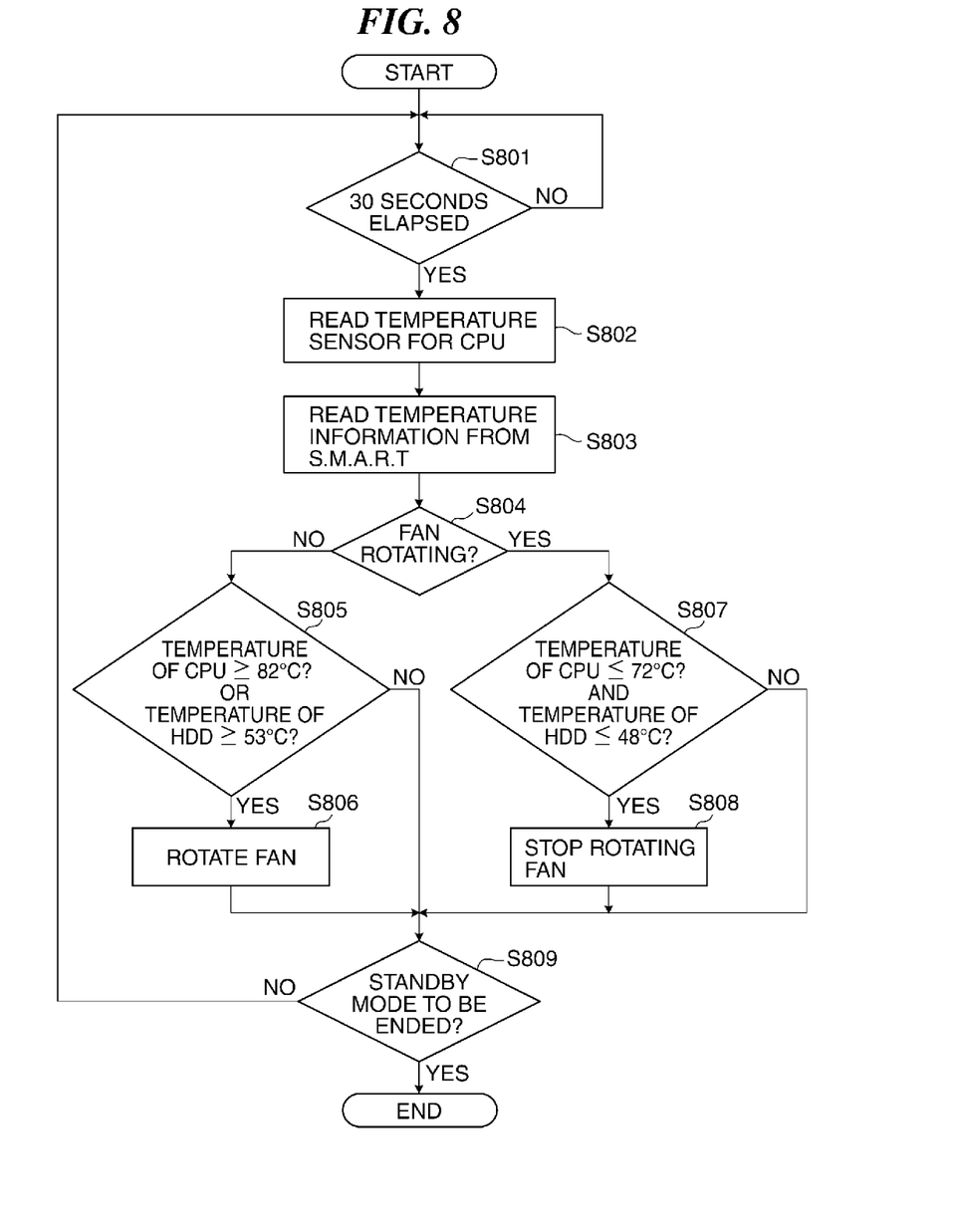
FIG. 8 is a flowchart showing an on-standby fan control process which is a cooling method for an information processing apparatus according to a second embodiment of the present invention.

FIG. 8 is a flowchart showing an on-standby fan control process which is a cooling method for the information processing apparatus according to the present embodiment. Steps in this process as well are implemented by the CPU 110 executing a program for this process unless otherwise specified. It should be noted that the process in FIG. 8 is based on the assumption that mirroring control is applied to the MFP 101 and is carried out in place of the process in FIG. 6 in the step 501 of the process in FIG. 5.

First, when the MFP 101 shifts into the standby mode, the CPU 110 reads the temperature measured by the temperature sensor 121 at intervals of a predetermined time period, for example, 30 seconds (steps S801, S802). Next, the CPU 110 reads temperature information on the HDD-A 119 and the HDD-B 120 recorded using S.M.A.R.T (Self-Monitoring Analysis and Reporting Technology) (step S803). S.M.A.R.T is a system included in HDDs so as to early detect failures of the HDDs and anticipate breakdown of the HDDs and records various test items, which are self-diagnosed in real time while the HDDs are running, as numeric values. Temperature is a factor that causes a failure of an HDD and is thus a test item in S.M.A.R.T. It should be noted that since the HDD-A 119 and the HDD-B 120 are placed in proximity to each other, and the temperature of one influences the temperature of the other, there is only a little difference in temperature between the HDD-A 119 and the HDD-B 120. Thus, the temperature information read in the step S803 has only to be temperature information on at least one of the HDD-A 119 and the HDD-B 120 (hereafter referred to merely as "HDD temperature information"). Then, it is determined whether or not the controller cooling fan 116 is rotating (step S804).

As a result of the determination in the step S804, when the controller cooling fan 116 is at a standstill, it is determined whether or not the temperature measured by the temperature sensor 121, which was read in the step S802, is equal to or higher than, for example, 82° C. (a predetermined temperature). Further, it is determined whether or not the HDD temperature information read in the step S803 is indicative of a temperature equal to or higher than, for example, 53° C. (a predetermined temperature) (step S805). As a result of the determination in the step S805, when the temperature measured by the temperature sensor 121 is equal to or higher than 82° C., or the HDD temperature information read in the step S803 is indicative of a temperature equal to or higher than 53° C., the CPU 110 instructs the power-source/fan control IC 115 to rotate the controller cooling fan 116. In response to this instruction, the power-source/fan control IC 115 rotates the controller cooling fan 116 (step S806), followed by the process proceeding to step S809. As a result of the determination in the step S805, when the temperature measured by the temperature sensor 121 is lower than 82° C., and the HDD temperature information is indicative of a temperature lower than 53° C., the process proceeds to the step S809 without the controller cooling fan 116 being rotated. It should be noted that in the step S805, it is preferred that only when both temperature information on the HDD-A 119 and temperature information on the HDD-B 120 are indicative of a temperature lower than 53° C., it is determined that the HDD temperature information is indicative of a temperature lower than 53° C.

As a result of the determination in the step S804, when the controller cooling fan 116 is rotating, it is determined whether or not the temperature measured by the temperature sensor 121, which was read in the step S802, is equal to or lower than, for example, 72° C. (a predetermined temperature). Further, it is determined whether or not the HDD temperature information read in the step S803 is indicative of a temperature equal to or lower than, for example, 48° C. (a predetermined temperature) (step S807). As a result of the determination in the step S807, when the temperature measured by the temperature sensor 121 is equal to or lower than 72° C., and the HDD temperature information is indicative of a temperature equal to or lower than 48° C., the CPU 110 instructs the power-source/fan control IC 115 to stop the controller cooling fan 116. In response to this instruction, the power-source/fan control IC 115 stops the controller cooling fan 116 (step S808), followed by the process proceeding to the step S809. It should be noted that in the step S807, it is preferred that only when both temperature information on the HDD-A 119 and temperature information on the HDD-B 120 are indicative of a temperature equal to or lower than 48° C., it is determined that the HDD temperature information is indicative of a temperature equal to or lower than 48° C. As a result of the determination in the step S807, when the temperature measured by the temperature sensor 121 is higher than 72° C., or the HDD temperature information is indicative of a temperature higher than 48° C., the process proceeds to the step S809 without the controller cooling fan 116 being stopped.

It is then determined whether or not the standby mode is to be ended (step S809). As a result of the determination in the step S809, when the standby mode is not to be ended, the process returns to the step S801, and when the standby mode is to be ended, the present process is ended, followed by the process proceeding to the step 502.

According to the process in FIG. 8, when mirroring control is applied to the MFP 101, operation of the controller cooling fan 116 is controlled according to not only the temperature measured by the temperature sensor 121 (the temperature of the CPU 110) but also the HDD temperature information. Namely, when the HDD-B 120 is added to the MFP 101 to bring about an increase in the amount of heat generation, operation of the controller cooling fan 116 is controlled according to the HDD temperature information as well. As a result, the controller cooling fan 116 is prevented from being stopped although the HDD-A 119 or the HDD-B 120 is at high temperatures. This prevents the HDD-A 119 and the HDD-B 120 from being heated to a high temperature and breaking down. Moreover, the controller cooling fan 116 is prevented from continuing to rotate although the HDD-A 119 and the HDD-B 120 are at low temperatures.

Further, according to the process in FIG. 8, temperature information of the HDD-A 119 and the HDD-B 120 recorded using S.M.A.R.T is used, and this eliminates the need to add temperature sensors for the HDD-A 119 and the HDD-B 120. This prevents the cost of the MFP 101 from increasing.

Although the present invention has been described by way of the embodiments, the present invention should not be limited to the embodiments described above.

For example, although in the embodiments described above, a precondition for applying the present invention is that the HDD-B 120 is additionally installed, the present invention may also be applied in a case where an SSD (solid-state drive) is additionally installed in place of an HDD. Alternatively, the present invention may be applied in a case where an optional board or the like generating a large amount of heat is additionally mounted on a controller substrate.

In the process in FIG. 6 and the process in FIG. 8, whether or not the controller cooling fan 116 is rotating is determined first on the assumption that operation of the controller cooling fan 116 is to be controlled (step S603 and step S804). However, the CPU 110 may manage a temperature state of the MFP 101 (hereafter referred to as "the temperature state of the apparatus") as a high-temperature state or a low-temperature state, and operation of the controller cooling fan 116 may be controlled according to the temperature state of the apparatus.

Specifically, in the step S603 of the process in FIG. 6, it is determined whether the temperature state of the apparatus is the high-temperature state or the low-temperature state. As a result of the determination in the step S603, when the temperature state of the apparatus is the low-temperature state, it is determined whether or not the temperature measured by the temperature sensor 121, which was read in the step S602, is equal to or higher than, for example, 82° C. (step S604). When the temperature measured by the temperature sensor 121 is equal to or higher than 82° C., the power-source/fan control supply IC 115 rotates the controller cooling fan 116 (step S605), and the CPU 110 changes the temperature state of the apparatus to the high-temperature state. The process then proceeds to the step 5608. When the temperature measured by the temperature sensor 121 is lower than 82° C., the process proceeds to the step S608 without rotating the controller cooling fan 116. As a result of the determination in the step S603, when the temperature state of the apparatus is the high-temperature state, it is determined whether or not the temperature measured by the temperature sensor 121 is equal to or lower than, for example, 72° C. (step S606). When the temperature measured by the temperature sensor 121 is equal to or lower than 72° C., the power-source/fan control supply IC 115 stops the controller cooling fan 116 (step S607), and the CPU 110 changes the temperature state of the apparatus to the low-temperature state. The process then proceeds to the step 5608. When the temperature measured by the temperature sensor 121 is higher than 72° C., the process proceeds to the step S608 without the controller cooling fan 116 being stopped.

Further, specifically, in the step S804 of the process in FIG. 8, it is determined whether or not the temperature state of the apparatus is the high-temperature state. As a result of the determination in the step S804, when the temperature state of the apparatus is the low-temperature state, it is determined whether or not the temperature measured by the temperature sensor 121, which was read in the step S802, is equal to or higher than, for example, 82° C. Further, it is determined whether or not the HDD temperature information read in the step S803, is indicative of a temperature equal to or higher than, for example, 53° C. (step S805). When the temperature measured by the temperature sensor 121 is equal to or higher than 82° C., or the HDD temperature information is indicative of a temperature equal to or higher than 53° C., the power-source/fan control supply IC 115 rotates the controller cooling fan 116 (step S806), and the CPU 110 changes the temperature state of the apparatus to the high-temperature state. The process then proceeds to the step S809. When the temperature measured by the temperature sensor 121 is lower than 82° C., and the HDD temperature information is indicative of a temperature lower than 53° C., the process proceeds to the step S809 without the controller cooling fan 116 being rotated. As a result of the determination in the step S804, when the temperature state of the apparatus is the high-temperature state, it is determined whether or not the temperature measured by the temperature sensor 121 is equal to or lower than, for example, 72° C., and the HDD temperature information is indicative of a temperature equal to or higher than, for example, 48° C. (step S807). As a result of the determination in the step 5807, when the temperature measured by the temperature sensor 121 is equal to or lower than 72° C., and the HDD temperature information is indicative of a temperature equal to or lower than 48° C., the controller cooling fan 116 is stopped (step S808), and the CPU 110 changes the temperature state of the apparatus to the low-temperature state. The process then proceeds to the step S809.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blue-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-173051, filed Sep. 2, 2015 which is hereby incorporated by reference herein in its entirety.

What is claimed is:

1. An information processing apparatus comprising:
   a cooling device;
   a temperature sensor;
   an interface configured to be connectable to a plurality of storage devices; and
   a control unit configured to:

control the cooling device according to a detection result of the temperature sensor in a predetermined power mode, in a case where only one storage device is connected to the interface; and control the cooling device without using the detection result of the temperature sensor in the predetermined power mode, in a case where plural storage devices are connected to the interface.

2. The information processing apparatus according to claim 1,
wherein the information processing apparatus is able to shift into a sleep mode in which power supply to the control unit is stopped or into a standby mode in which electrical power is supplied to the control unit, and
in the case where only one storage device is connected to the interface, the control unit is configured to control the cooling device according to the detection result of the temperature sensor in the standby mode, which is the predetermined power mode, and not control the cooling device in the sleep mode.

3. The information processing apparatus according to claim 2, wherein the information processing apparatus is able to shift into a job execution mode in which a job is executed, and
in the case where only one storage device is connected to the interface, the control unit is configured to control the cooling device to be activated in the job execution mode.

4. The information processing apparatus according to claim 2, wherein,
in the case where plural storage devices are connected to the interface, the control unit is configured to control the cooling device to be activated in the standby mode, and not control the cooling device in the sleep mode.

5. The information processing apparatus according to claim 1, wherein, in the case where only one storage device is connected to the interface and a temperature detected by the temperature sensor is equal to or higher than a predetermined temperature, the control unit is configured to control the cooling device to be activated in the predetermined power mode.

6. The information processing apparatus according to claim 1, wherein in the case where only one storage device is connected to the interface and a temperature detected by the temperature sensor is equal to or lower than a predetermined temperature, the control unit is configured to not control the cooling device in the predetermined power mode.

7. The information processing apparatus according to claim 1, wherein each storage device of the plural storage devices is a hard disk drive.

8. The information processing apparatus according to claim 1, wherein in the case where only one storage device is connected to the interface, the control unit is configured to control the cooling device according to the detection result of the temperature sensor and temperature information of the storage devices acquired from the storage devices.

9. The information processing apparatus according to claim 1, further comprising a printing unit which prints an image on a sheet.

10. The information processing apparatus according to claim 1, wherein the control unit is configured to acquire temperature output from the temperature sensor at intervals of a predetermined time period and control the cooling device according to the acquired temperature.

11. A control method for an information processing apparatus that has a cooling device, a temperature sensor and an interface configured to be connectable to a plurality of storage devices, the control method comprising:
controlling the cooling device according to a detection result of the temperature sensor in a predetermined power mode, in a case where only one storage device is connected to the interface; and
controlling the cooling device without using the detection result of the temperature sensor in the predetermined power mode, in a case where plural storage devices are connected to the interface.

12. The information processing apparatus according to claim 1, wherein the control unit is a processor and the processor has the temperature sensor incorporated therein.

13. An information processing apparatus comprising:
a cooling device;
a temperature sensor;
an interface configured to be connectable to a plurality of storage devices; and
a control unit configured to, in a predetermined power mode:
control the cooling device according to a detection result of the temperature sensor in a case where mirroring control for storing same data in plural storage devices is not applied, and
control the cooling device without using the detection result of the temperature sensor in a case where the mirroring control is applied.

14. The information processing apparatus according to claim 13, wherein the information processing apparatus is able to shift into a sleep mode in which power supply to the control unit is stopped or into a standby mode in which electrical power is supplied to the control unit, and
in a case where the mirroring control is not applied, the control unit is configured to control the cooling device according to the detection result of the temperature sensor in the standby mode, which is the predetermined power mode, and not control the cooling device in the sleep mode.

15. The information processing apparatus according to claim 14, wherein the information processing apparatus is able to shift into a job execution mode in which a job is executed, and
in the case where the mirroring control is not applied, the control unit is configured to control the cooling device to be activated in the job execution mode.

16. The information processing apparatus according to claim 14, wherein, in the case where the mirroring control is applied, the control unit is configured to control the cooling device to be activated in the standby mode, and not control the cooling device in the sleep mode.

17. The information processing apparatus according to claim 13 wherein, in the case where the mirroring control is not applied and a temperature detected by the temperature sensor is equal to or higher than a predetermined temperature, the control unit is configured to control the cooling device to be activated in the predetermined power mode.

18. The information processing apparatus according to claim 13 wherein, in the case where the mirroring control is not applied and a temperature detected by the temperature sensor is equal to or lower than a predetermined temperature, the control unit is configured to not control the cooling device in the predetermined power mode.

19. The information processing apparatus according to claim 13 wherein each storage device of the plurality of storage devices is a hard disk drive.

20. The information processing apparatus according to claim 13, wherein, in the case where the mirroring control is not applied, the control unit is configured to control the cooling device according to the detection result of the temperature sensor and temperature information of the storage devices acquired from the storage devices.

21. The information processing apparatus according to claim 13, further comprising a printing unit which prints an image on a sheet.

22. The information processing apparatus according to claim 13, wherein the control unit is configured to acquire temperature output from the temperature sensor at intervals of a predetermined time period and control the cooling device according to the acquired temperature.

23. The information processing apparatus according to claim 13, wherein the control unit is a processor and the processor has the temperature sensor incorporated therein.

24. A control method for an information processing apparatus that has a cooling device, a temperature sensor and an interface configured to be connectable to a plurality of storage devices, the control method comprising:
   controlling the cooling device according to a detection result of the temperature sensor in a case where mirroring control for storing same data in plural storage devices is not applied; and
   controlling the cooling device without using the detection result of the temperature sensor in a case where the mirroring control is applied.

* * * * *